United States Patent [19]

Riley

[11] Patent Number: 5,443,653
[45] Date of Patent: Aug. 22, 1995

[54] SYSTEM FOR CLEANING CONTAMINANTS FROM SMALL AREAS WITH MINIMAL INCONTAINED WASTE

[75] Inventor: Sean F. Riley, Tucson, Ariz.

[73] Assignee: Hughes Missile Systems Companh, Los Angeles, Calif.

[21] Appl. No.: 252,471

[22] Filed: Jun. 1, 1994

[51] Int. Cl.$^6$ ............................................. B08B 5/04
[52] U.S. Cl. ............................. 134/8; 134/21; 15/320; 15/344
[58] Field of Search ............... 134/21, 8; 433/91, 95; 15/320, 321, 344, 345, 348, 415.1, 416

[56] References Cited

U.S. PATENT DOCUMENTS

| | | | |
|---|---|---|---|
| 3,897,604 | 8/1975 | Weimer | 15/344 |
| 4,956,891 | 9/1990 | Wulff | 15/321 |
| 4,974,618 | 12/1990 | Nysted | 134/21 |
| 5,236,512 | 8/1993 | Rogers et al. | 134/21 |
| 5,286,301 | 2/1994 | Albrecht | 134/21 |
| 5,289,610 | 3/1994 | Monson | 15/344 |

*Primary Examiner*—Scott Kastler
*Attorney, Agent, or Firm*—Charles D. Brown; Randall M. Heald; Wanda K. Denson-Low

[57] ABSTRACT

A system for cleaning contaminants from small areas with minimal uncontained waste. The invention (10) includes a nozzle (60) having a first aperture for ejecting a fluid and a second aperture for providing suction. The first nozzle ejects a pressurized fluid and the second nozzle provides suction. In a particular embodiment, the first and second apertures are coaxial. Thus, contaminants and residues are dislodged and dissolved by cleaning solvent ejected through the first aperture while the second aperture effectively removes the waste material from a small cleaning area.

18 Claims, 2 Drawing Sheets

SYSTEM FOR CLEANING CONTAMINANTS FROM SMALL AREAS WITH MINIMAL INCONTAINED WASTE

BACKGROUND OF THE INVENTION

1. Field of the Invention

The present invention relates to cleaning systems and techniques. More specifically, the present invention relates to systems and techniques for cleaning solder flux and other contaminants from printed circuit boards, precision machinery and the like.

2. Description of the Related Art

The manufacture of printed circuit boards, printed wiring boards and the like typically involves the use of solder to effect electrical connection between components disposed thereon. The soldering operation typically left a residue of resin or other contaminant on the board which had to be removed to insure reliable operation of the system. The removal of these residues has been complicated by the fact that the residues are often left under parts and in crevices between parts.

In the past, fluxes were used for the solder which were very soluble in certain chemicals which were hazardous to the environment. At that time, interim cleaning was achieved by visually inspecting the board and then immersing the board in the solvent and/or solvent vapors. However, in response to government regulations restricting the use of such chemical cleaners, water soluble fluxes were developed. However, the use of water soluble fluxes prohibits the immersion of the boards in water after a certain point in the assembly of same. As a result, the water soluble residues are generally removed manually with a brush and a cleaning solvent. This approach has been limited by the relatively low level of mechanical action associated therewith.

Mechanical cleaning systems are known in the art. Carpet cleaners, for example, offer a mechanical cleaning action by which a cleaning fluid is ejected and then collected by the cleaning mechanism. However, no such device is known to be available for use in the tight crevices of a printed circuit board.

While dental tools allow for access to small spaces, these devices generally wash or vacuum but do not wash and vacuum the area with a single unit.

Thus, there has been a need in the art for a system for cleaning flux contaminants on a printed circuit board or a printed wiring assembly resulting from the use of water soluble flux with some mechanism for dislodging, dissolving and removing contaminants from the area while confining cleaning action to small areas and at the same time producing minimal uncontained waste.

SUMMARY OF THE INVENTION

The need in the art is addressed by the present invention which provides a system for cleaning contaminants from small areas and produces minimal uncontained waste. In a most general sense, the inventive system includes a nozzle having a first aperture for ejecting a pressurized fluid and a second aperture for providing suction. In a particular embodiment, the first and second apertures are coaxial. Thus, contaminants and residues are dislodged and dissolved by cleaning solvent ejected through the first aperture while the second aperture effectively removes the waste material from a small cleaning area.

In a more specific implementation, the invention allows for a selection between two fluids for ejection, one of which may be heated for more effective cleaning. In addition, a gas may be ejected coaxially under pressure to create a cleaning fog. The fluids and the waste materials are stored in high pressure bottles.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof.

Figure 1:
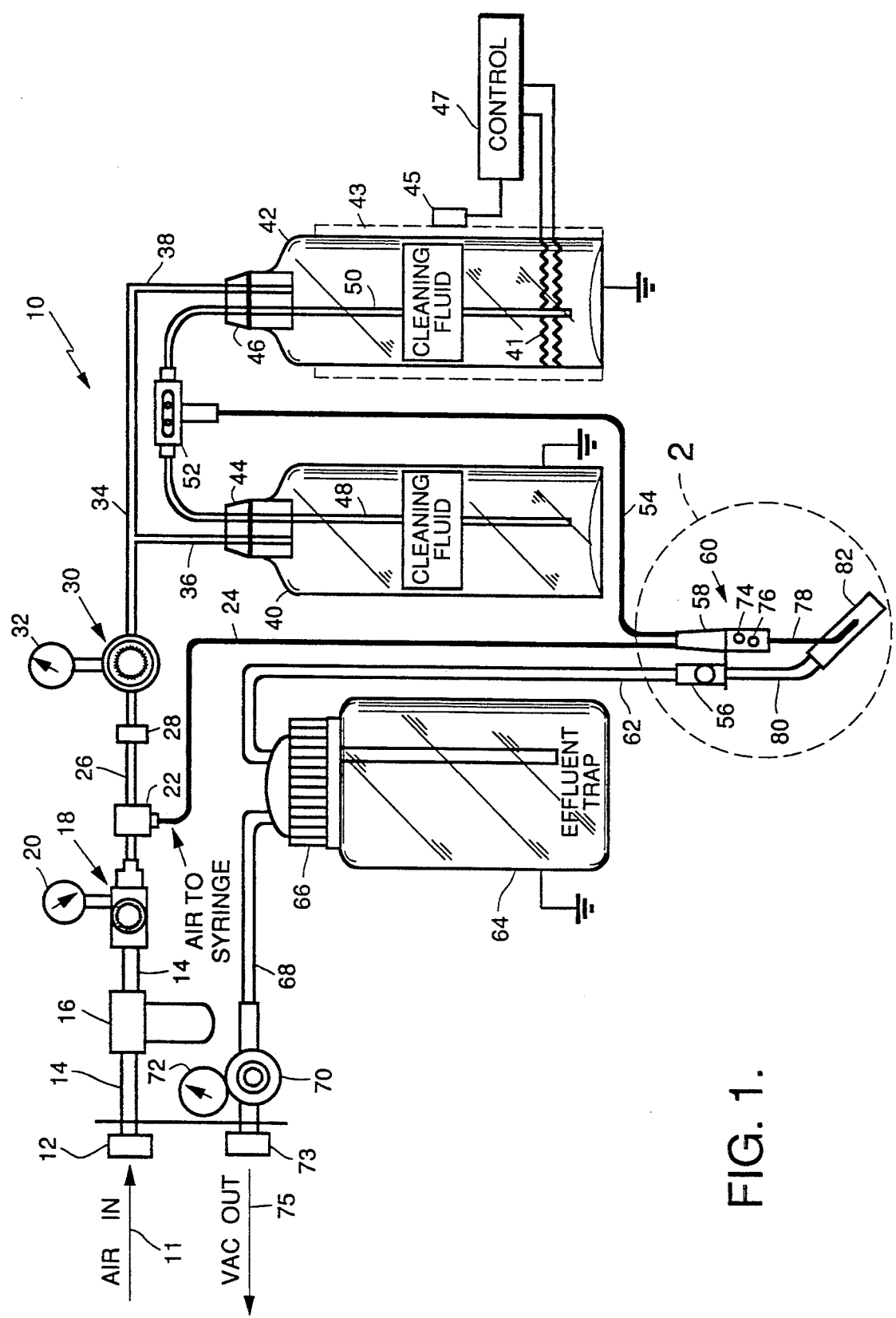
FIG. 1 is a simplified diagram of the small area cleaning system of the present invention.

FIG. 1 is a simplified diagram of the small area cleaning system of the present invention. The invention 10 includes a first coupling 12 adapted to attach to a source of pressurized air 11. Pressurized air is filtered and dried by a filter/drier 16 and input to a master air pressure regulator 18 with associated gauge 20 via a line 14. The master air regulator 18 regulates air pressure to the fluid dispensing system 10 while regulating air pressure to the orifices. The master regulator 18 is connected to a coupling 22. The coupling feeds air to a first line 24 and to a second line 26. The first line provides air to a nozzle assembly as discussed more fully below. The second line is coupled to a fluid pressure regulator 30. The fluid pressure regulator 30 has an associated pressure gauge 32. The fluid pressure regulator 30 regulates air pressure over fluid in first and second pressure bottles 40 and 42 supplied by lines 36 and 38, respectively, which are connected to the fluid pressure regulator 30 via a line 34. Each of the pressure bottles is constructed of stainless steel and sealed with "Buna-N" seals 44, 46. By controlling air pressure over fluid in the pressure bottles, fluid pressure at the fluid orifice is controlled. In an illustrative application, the first bottle 40 contains alcohol and the second bottle contains water. Obviously, other cleaning fluids may be stored in the bottles without departing from the scope of the present invention. Air pressure in the bottles forces fluid into lines 48 or 50 and into a fluid routing valve 52. The valve allows for selection of solvent fluid to be directed to the nozzle assembly 60 via a line 54.

The second bottle is heated by a heating element 41 disposed in a patch heater 43 which is taped to the bottle 42. A thermocouple 45 is attached to the bottle to monitor the temperature thereof. Heat energy supplied by the heating element 43 is controlled by a control unit 47.

Suction is provided to the nozzle assembly 60 by an external evacuator 75 such as a venturi-vacuum via a line 62 which connects the nozzle assembly 60 to an effluent trap 64, a vacuum regulator 70 with associated gauge 72 and a coupling 73. The effluent trap 64 has a seal 66 and is connected to the vacuum regulator 70 via a line 68.

Figure 2:
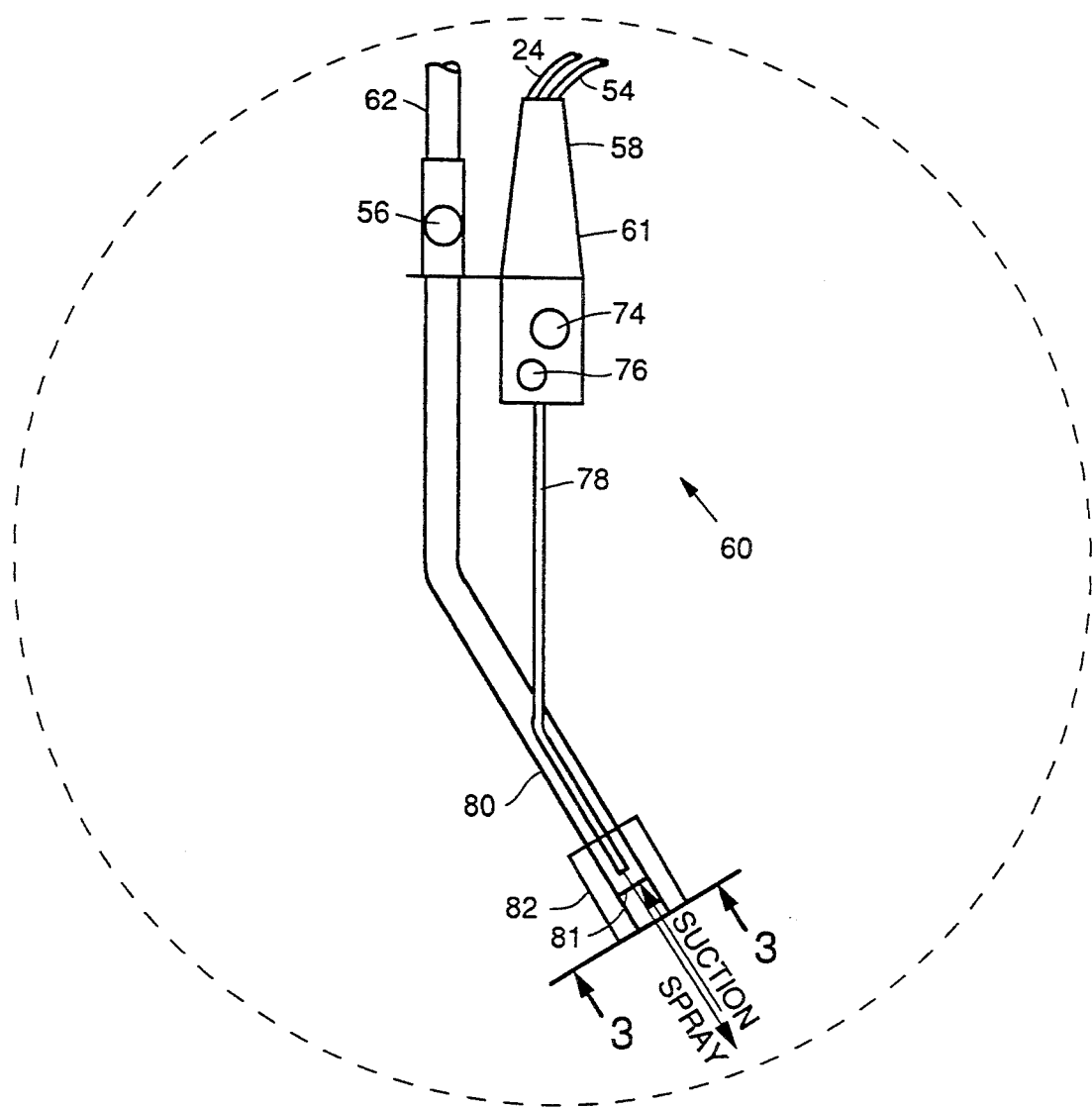
FIG. 2 is a magnified view of the advantageous nozzle assembly of the present invention.

FIG. 2 is a magnified view of the advantageous nozzle assembly 60 of the present invention. The air pressure line 24 feeds into the handle 58 of an air-water syringe 61 such as that sold by Dental Components International. The handle 58 is equipped with a fluid dispenser switch 74 and an air dispenser switch 76. The fluid and air dispenser switches 74, 76 allow for the selection of fluid and/or air for ejection. The air and fluid switches 74 and 76 may be implemented as foot switches without departing from the scope of the present teachings. Ejection is effected via a line 78 which is disposed within a suction line 80. The suction line 80 is connected to the vacuum line 62 via a control valve 56. A flexible fitting 82 is disposed about the tip 81 of nozzle 80.

Figure 3:
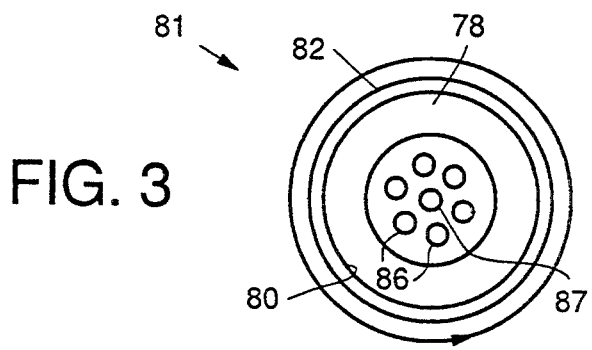
FIG. 3 is an end view of the tip of the nozzle of the present invention.

FIG. 3 is an end view of the tip 81 of the nozzle 60. The suction tube 80 is disposed within the flexible fitting 82. A fluid orifice 84 is disposed within and coaxial with the suction tube 80. The fluid orifice connects to the fluid dispenser switch 74. A plurality of air orifices 86 are disposed peripherally and coaxially about the fluid orifice 84. The air orifices 86 are connected to the air dispenser switch 76. The design of the nozzle tip 81 effectively allows for the ejection of a selected fluid and/or gas and the containment of contaminants dislodged thereby by virtue of the coaxial, peripheral location of the suction tube. The design of the wand is effective to allow for a cleaning stream to be directed and contained manually.

Thus, the present invention has been described herein with reference to a particular embodiment for a particular application. The materials of construction should be chosen in light of the solvents being used. Those having ordinary skill in the art and access to the present teachings will recognize additional modifications applications and embodiments within the scope thereof.

It is therefore intended by the appended claims to cover any and all such applications, modifications and embodiments within the scope of the present invention.

Accordingly,

What is claimed is:

1. A system for cleaning contaminants from small areas with minimal uncontained waste comprising:
   nozzle means having a first aperture for ejecting a fluid and a second aperture for providing suction;
   first means for providing pressurized fluid to said nozzle means, said first means including first storage means for providing a first fluid and second storage means for providing a second fluid; and
   second means for providing vacuum pressure to said nozzle means.

2. The invention of Claim 1 wherein said first aperture is coaxial with said second aperture.

3. The invention of Claim 2 wherein said nozzle means includes a first nozzle for ejecting a fluid, a second nozzle for ejecting a gas and a third nozzle for providing suction.

4. The invention of Claim 3 wherein said nozzle means further includes a first switch for controlling the flow of said fluid.

5. The invention of Claim 4 wherein said nozzle means further includes a second switch for controlling the flow of said gas.

6. The invention of Claim 5 wherein said nozzle means includes a control valve for controlling said vacuum pressure.

7. The invention of Claim 1 further including means for heating said first fluid.

8. The invention of Claim 1 further including means for selecting said first fluid or said second fluid for ejection by said nozzle.

9. The invention of Claim 1 further including means for providing pressure to said first storage means and said second storage means.

10. The invention of Claim 1 wherein said second means includes third storage means for storing waste materials.

11. A system for cleaning contaminants from small areas with minimal uncontained waste comprising:
    nozzle means including a first nozzle for ejecting a fluid, a second nozzle for ejecting a gas and a third nozzle for providing suction, said first and second nozzles being disposed within said third nozzle;
    first means for providing pressurized fluid to said nozzle means, said first means including first storage means for providing a first fluid and second storage means for providing a second fluid;
    second means for providing pressurized gas to said nozzle means; and
    third means for providing vacuum pressure to said nozzle means.

12. The invention of Claim 11 wherein said nozzle means further includes a first switch for controlling the flow of said fluid.

13. The invention of Claim 12 wherein said nozzle means further includes a second switch for controlling the flow of said gas.

14. The invention of Claim 13 wherein said nozzle means includes a control valve for controlling said vacuum pressure.

15. The invention of Claim 11 further including means for selecting said first fluid or said second fluid for ejection by said nozzle.

16. The invention of Claim 11 wherein said first means includes means for heating said fluid.

17. The invention of Claim 11 further including means for providing pressure to said first storage means and said second storage means.

18. The invention of Claim 11 wherein said third means includes third storage means for storing waste materials.

* * * * *